United States Patent
Kang

(10) Patent No.: US 7,081,784 B2
(45) Date of Patent: Jul. 25, 2006

(54) DATA OUTPUT CIRCUIT OF MEMORY DEVICE

(75) Inventor: Yong Gu Kang, Chungcheongbuk-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 28 days.

(21) Appl. No.: 11/008,254

(22) Filed: Dec. 10, 2004

(65) Prior Publication Data
US 2006/0103444 A1    May 18, 2006

(30) Foreign Application Priority Data
Nov. 15, 2004    (KR) ...................... 10-2004-0093221

(51) Int. Cl.
*H03K 3/00* (2006.01)
(52) U.S. Cl. ...................... 327/291; 327/158
(58) Field of Classification Search ................ 327/149, 327/158, 153, 161, 291, 294, 298; 326/82; 365/233; 711/167
See application file for complete search history.

(56) References Cited

U.S. PATENT DOCUMENTS

| 5,796,673 | A | 8/1998 | Foss et al. | 365/233 |
| 6,323,705 | B1 | 11/2001 | Shieh et al. | 327/158 |
| 6,381,194 | B1 | 4/2002 | Li | 365/233 |
| 6,407,962 | B1 | 6/2002 | Ka | 365/233 |
| 6,446,180 | B1 | 9/2002 | Li et al. | 711/167 |
| 6,480,033 | B1 | 11/2002 | Shinozaki | 326/105 |
| 6,801,989 | B1 | 10/2004 | Johnson et al. | 711/167 |
| 6,803,826 | B1 | 10/2004 | Gomm et al. | 331/11 |
| 2003/0002357 | A1 | 1/2003 | Kwon et al. | 365/199 |
| 2003/0223279 | A1 | 12/2003 | Lee | 365/196 |
| 2004/0150445 | A1 | 8/2004 | Gomm et al. | 327/158 |

FOREIGN PATENT DOCUMENTS

KR    2003042066 A    *    5/2003

* cited by examiner

*Primary Examiner*—Linh My Nguyen
(74) *Attorney, Agent, or Firm*—Heller Ehrman LLP

(57) ABSTRACT

A data output circuit of a memory device comprises an output enable signal generating unit, an output driving unit, an output driving unit and an output enable control unit. The output enable signal generating unit generates a reference output enable signal in response to a read command and outputting a plurality of output enable signals in response to a rising DLL clock and a falling DLL clock. The output driving unit drives data synchronously with respect to the rising DLL clock and the falling DLL clock in response to the output enable signals at a read mode. The output enable control unit disables the falling DLL clock when the output enable signals are all disabled. As a result, current consumption is reduced because the falling DLL clock is generated only when the output enable signal is generated.

8 Claims, 5 Drawing Sheets

US 7,081,784 B2

DATA OUTPUT CIRCUIT OF MEMORY DEVICE

BACKGROUND ART

1. Field of the Invention

The present invention generally relates to a data output circuit of a memory device, and more specifically, to a technology of generating a clock only when an output enable signal is generated to reduce current consumption.

2. Description of the Prior Art

FIG. 1 is a block diagram illustrating a conventional data output circuit of a memory device. Here, a circuit having a burst length of 4 and a CAS latency of 6 is exemplified.

The conventional data output circuit of a memory device comprises a rising clock driving unit 2, a falling clock driving unit 4, an output enable signal generating unit 6 and an output driving unit 8.

The rising clock driving unit drives an internal rising DLL clock IRCKDLL generated from a Delay Locked Loop (hereinafter, abbreviated as "DLL") to generate a rising DLL clock RCKDLL. The falling clock driving unit 4 drives an internal falling DLL clock IFCKDLL generated from the DLL to generate a falling DLL clock FCKDLL.

The output enable signal generating unit 6 generates a reference output enable signal OE00 in response to a read command RD, output enable signals OE10, OE20, OE30, OE40, OE50 and OE60 in response to the rising DLL clock RCKDLL, and output enable signals OE15, OE25, OE35, OE45 and OE55 in response to the falling DLL clock FCKDLL.

The output driving unit 8 drives data inputted synchronously with respect to the rising DLL clock RCKDLL and the falling DLL clock FCKDLL in response to enable signals OE00~OE60 when the data are read, and outputs the driven data to an input/output pad DQ.

FIG. 2 is a timing diagram illustrating the operation of the data output circuit of FIG. 1.

The reference output enable signal OE00 is generated in response to the read command RD generated synchronously with respect to an external clock CLK inputted from a chip set.

Then, the output enable signals OE10~OE60 are sequentially generated in response to the rising DLL clock RCKDLL before the external clock CLK.

Also, the output enable signals OE15~OE55 are sequentially generated in response to the falling DLL clock CKDLL before a clock having an opposite phase to that of the external clock CLK.

Thereafter, first and third data DQ are outputted in response to the rising DLL clock RCKDLL (6.0 and 7.0), and second and fourth data DQ are outputted in response to the falling DLL clock FCKDLL (6.5 and 7.5).

The conventional data output circuit of a memory device, which includes a DLL, outputs the data DQ synchronously with respect to the rising DLL clock RCKDLL and the falling DLL clock FCKDLL. Here, the rising DLL clock RCKDLL is used in a replica delay block of the DLL, and the falling DLL clock FCKDLL is used only to output the corresponding data DQ. As a result, unnecessary operation current is consume when the corresponding data DQ are not outputted.

SUMMARY OF THE INVENTION

Accordingly, it is an object of the present invention to generate a falling DLL clock at a read mode while data are outputted, thereby reducing operation current.

In an embodiment, a data output circuit of a memory device comprises an output enable signal generating unit, an output driving unit, an output driving unit and an output enable control unit. The output enable signal generating unit generates a reference output enable signal in response to a read command and outputting a plurality of output enable signals in response to a rising DLL clock and a falling DLL clock. The output driving unit drives data synchronously with respect to the rising DLL clock and the falling DLL clock in response to the output enable signals at a read mode. The output enable control unit disables the falling DLL clock when the output enable signals are all disabled.

BRIEF DESCRIPTION OF THE DRAWINGS

Other aspects and advantages of the present invention will become apparent upon reading the following detailed description and upon reference to the drawings in which.

DETAILED DESCRIPTION OF THE PREFERRED EMBODIMENTS

The present invention will be described in detail with reference to the accompanying drawings.

Figure 1:
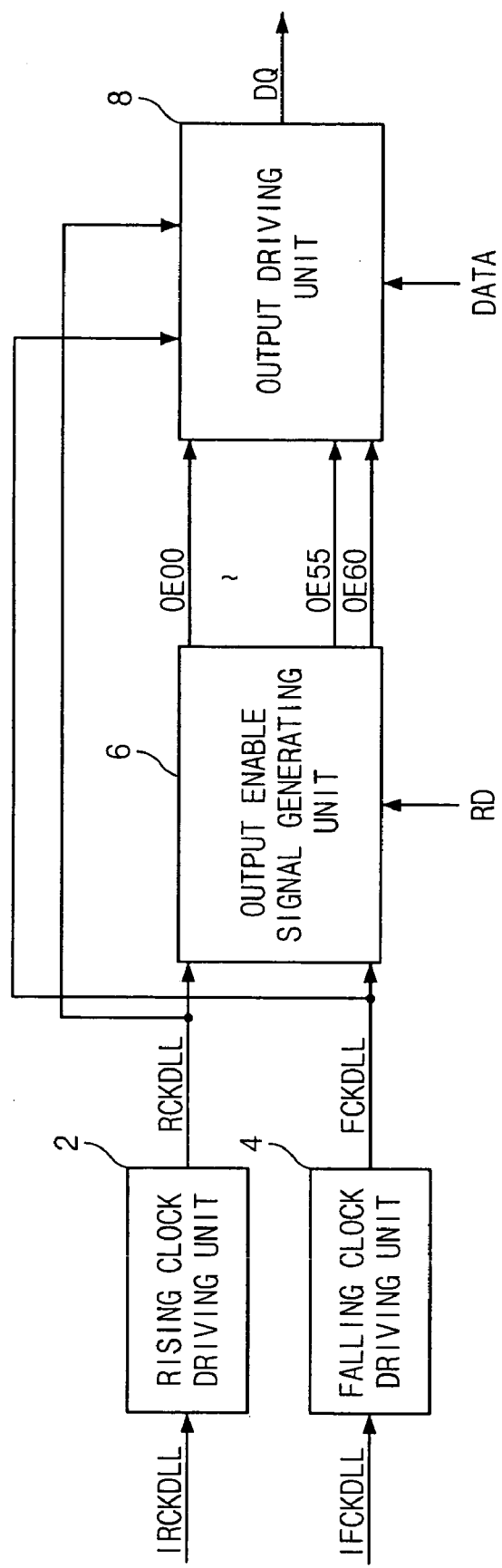
FIG. 1 is a block diagram illustrating a conventional data output circuit of a memory device.
Figure 2:
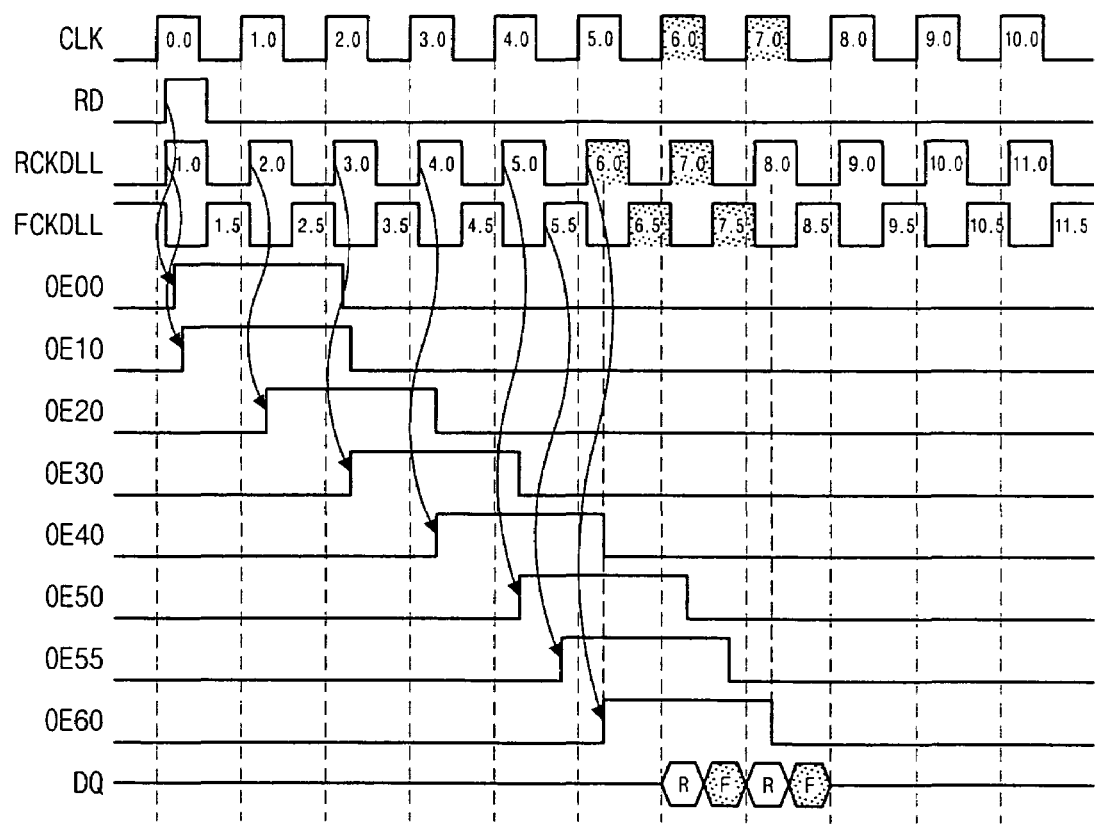
FIG. 2 is a timing diagram illustrating the operation of the data output circuit of FIG. 1.
Figure 3:
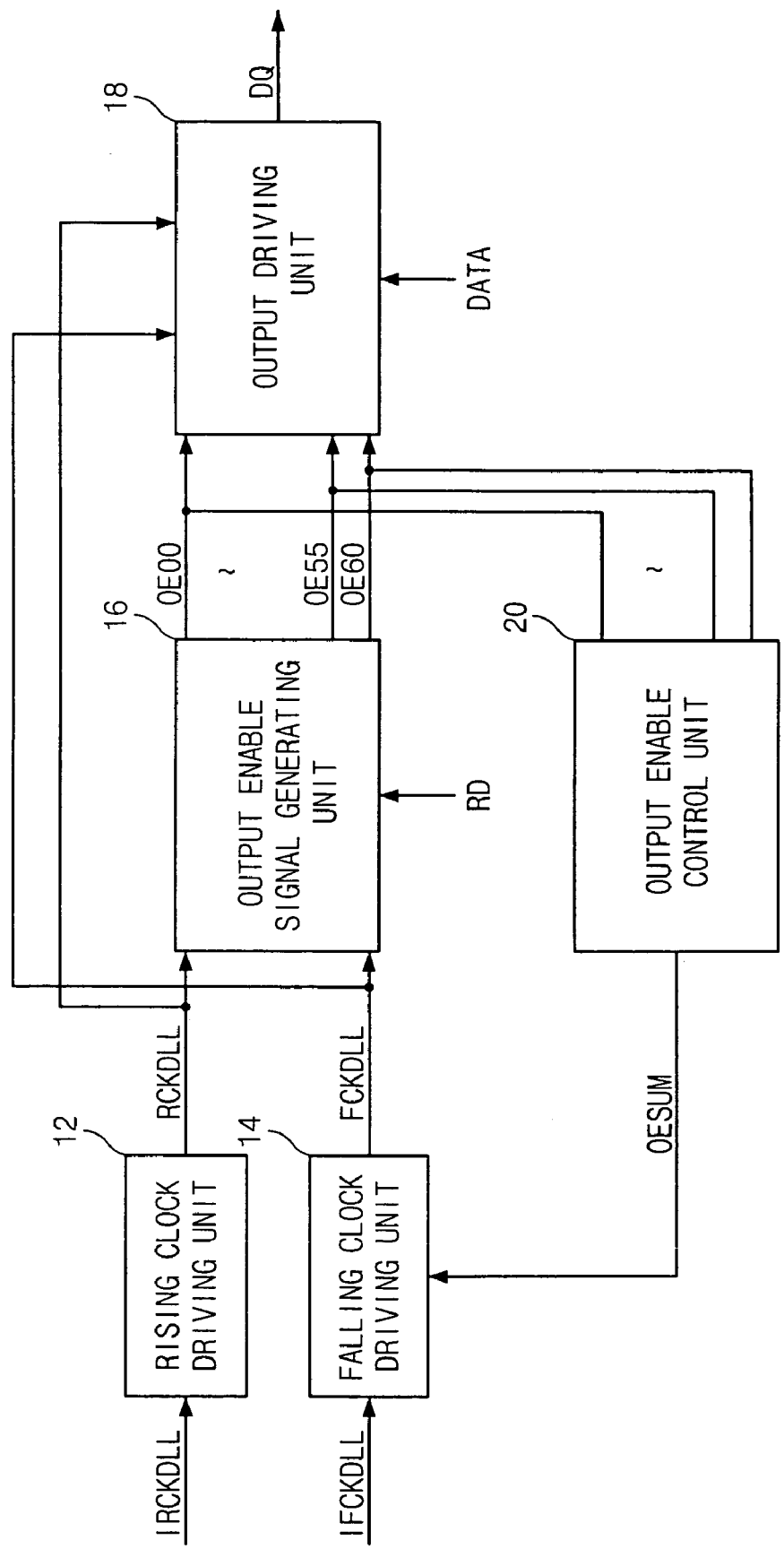
FIG. 3 is a block diagram illustrating a data output circuit of a memory device according to an embodiment of the present invention.

FIG. 3 is a block diagram illustrating a data output circuit of a memory device according to an embodiment of the present invention. Here, a circuit having a burst length of 4 and a CAS latency of 6 is exemplified.

In an embodiment, a data output circuit of a memory device comprises a rising clock driving unit 12, a falling clock driving unit 14, an output enable signal generating unit 16, an output driving unit 18 and an output enable control unit 20.

The rising clock driving unit 12 drives an internal rising DLL clock IRCKDLL generated from a DLL, and generates a rising DLL clock RCKDLL. The falling clock driving unit 14 drives an internal falling DLL clock IFCKDLL generated from the DLL, and generates a falling DLL clock FCKDLL.

The output enable signal generating unit 16 generates a reference output enable signal OE00 in response to a read command RD, output enable signals OE10, OE20, OE30, OE40, OE50 and OE60 in response to the rising DLL clock RCKDLL, and output enable signals OE15, OE25, OE35, OE45 and OE55 in response to the falling DLL clock FCKDLL.

The output driving unit 18 outputs data DQ synchronously with respect to the rising DLL clock RCKDLL and the falling DLL clock FCKDLL in response to the output enable signals OE00~OE60 at a read mode.

The output enable control unit 20 outputs a sum output enable signal OESUM obtained by summing the output enable signals OE00~OE60 outputted from the output enable signal generating unit 16, and controls the falling clock driving unit 14.

Figure 4:
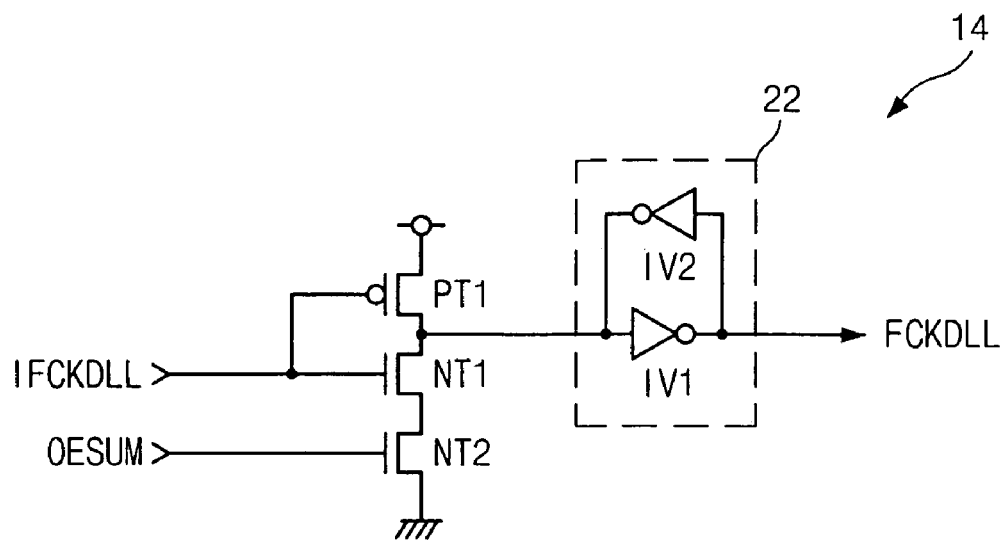
FIG. 4 is a circuit diagram illustrating a falling clock driving unit of FIG. 3.

FIG. 4 is a circuit diagram illustrating the falling clock driving unit 14 of FIG. 3.

The falling clock driving unit 14 comprises a PMOS transistor PT1, NMOS transistors NT1 and NT2, and a latch unit 22. Here, the latch unit 22 includes inverters IV1 and IV2.

The PMOS transistor PT1 and the NMOS transistor NT1 has a common gate to receive the internal falling DLL clock IFCLDLL, and the NMOS transistor NT2 selectively connects a source of the NMOS transistor NT1 to a ground terminal in response to the sum output enable signal OESUM.

The latch unit 22 latches a potential in a common drain of the PMOS transistor PT1 and the NMOS transistor NT1, and outputs the falling DLL clock FCKDLL.

Figure 5:
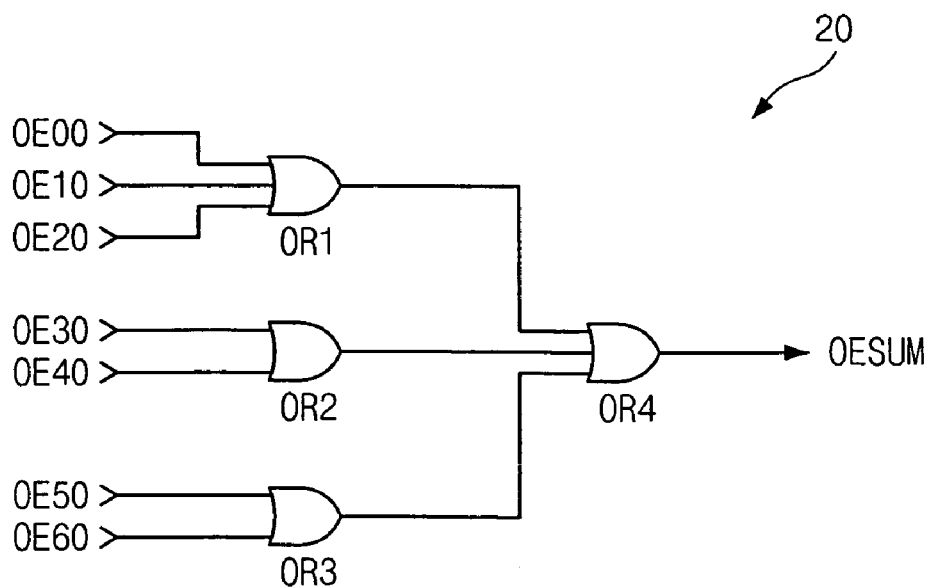
FIG. 5 is a circuit diagram illustrating an output enable control unit of FIG. 3.

FIG. 5 is a circuit diagram illustrating the output enable control unit 20 of FIG. 3.

The output enable control unit 20 comprises a plurality of OR gates OR1~OR4.

The first OR gate OR1 performs an OR operation on the reference output enable signal OE00, the first output enable signal OE10 and the second output enable signal OE20. The second OR gate OR2 performs an OR operation on the third output enable signal OE30 and the fourth output enable signal OE40. The third OR gate OR3 performs an OR operation on the fifth output enable signal OE50 and the sixth output enable signal OE60.

The fourth OR gate OR4 performs an OR operation on output signals from the OR gates OR1, OR2 and OR3 to output the sum output enable signal OESUM.

Figure 6:
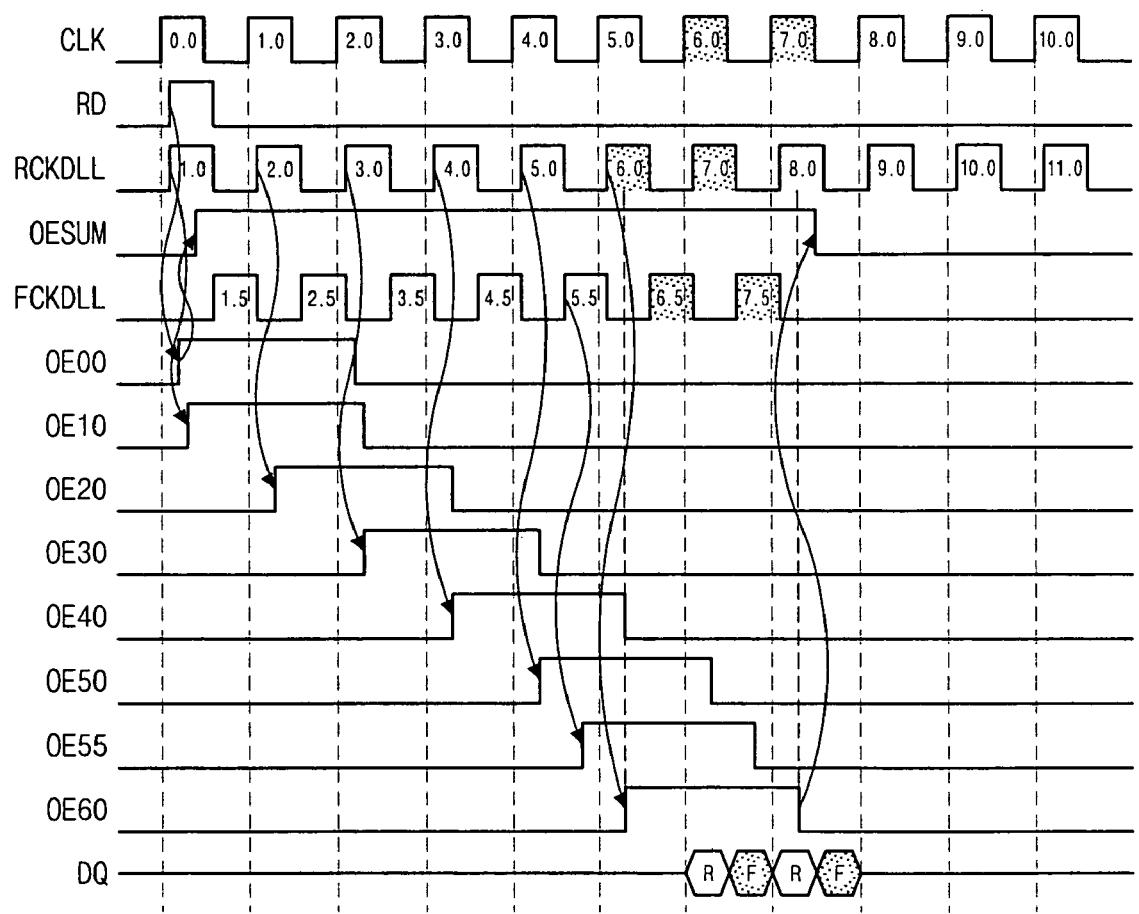
FIG. 6 is a timing diagram illustrating the operation of the data output circuit of FIG. 3.

FIG. 6 is a timing diagram illustrating the operation of the data output circuit of FIG. 3.

The reference output enable signal OE00 is generated in response to the read command RD synchronously with respect to the external clock CLK inputted from a chip set.

The output enable signals OE10~OE60 are sequentially generated in response to the rising DLL clock RCKDLL before the external clock CLK.

Then, the output enable signals OE15~OE55 are sequentially outputted in response to the falling DLL clock FCKDLL before a clock having an opposite phase to that of the external clock CLK.

Thereafter, first and third data DQ are outputted in response to the rising DLL clock RCKDLL (6.0 and 7.0), and second and fourth data DQ are outputted in response to the falling DLL clock FCKDLL (6.5 and 7.5).

The sum output enable signal OESUM becomes 'high' when one of the output enable signals OE00~OE60 is enabled to a high level. Then, the falling clock driving unit 14 generates a falling DLL clock FCKDLL in response to the internal falling DLL clock IFCKDLL.

Meanwhile, the sum output enable signal OESUM becomes 'low' when all of the output enable signals OE00~OE60 are disabled to a low level, thereby maintaining the falling DLL clock FCKDLL at a low level.

As a result, the operation of all circuits that receives the falling DLL clock FCKDLL is stopped, thereby reducing operation current.

As discussed earlier, a data output circuit of a memory device according to an embodiment of the present invention generates a falling DLL clock only while an output enable signal is enabled to a high level, and stops the operation of all circuits that receives the falling DLL clock, thereby reducing operation current.

While the invention is susceptible to various modifications and alternative forms, specific embodiments have been shown by way of example in the drawings and described in detail herein. However, it should be understood that the invention is not limited to the particular forms disclosed. Rather, the invention covers all modifications, equivalents, and alternatives falling within the spirit and scope of the invention as defined in the appended claims.

What is claimed is:

1. A data output circuit of a memory device, comprising:
   an output enable signal generating unit for generating a reference output enable signal in response to a read command and outputting a plurality of output enable signals in response to a rising DLL clock and a falling DLL clock;
   an output driving unit for driving data synchronously with respect to the rising DLL clock and the falling DLL clock in response to the output enable signals at a read mode; and
   an output enable control unit for disabling the falling DLL clock when the output enable signals are all disabled.

2. A data output circuit of a memory device, comprising:
   a rising clock driving unit for driving an internal rising DLL clock generated in a DLL to generate a rising DLL clock;
   a falling clock driving unit for driving an internal falling DLL clock generated in the DLL to generate a falling DLL clock;
   an output enable signal generating unit for generating a reference output enable signal in response to a read command, and outputting a plurality of output enable signals in response to the rising DLL clock and the falling DLL clock;
   an output driving unit for driving data synchronously with respect to the rising DLL clock and the falling DLL clock in response to the output enable signals at a read mode; and
   an output enable control unit for outputting a sum output enable signal to disable the falling clock driving unit when the output enable signals are all disabled.

3. The data output circuit according to claim 2, wherein the output enable control unit includes a plurality of logic means for combining the output enable signals.

4. The data output circuit according to claim 3, wherein the logic means is an OR gate.

5. The data output circuit according to claim 2, wherein the falling clock driving unit comprises:
   a driving unit for driving the internal falling DLL clock; and
   a control unit for controlling the driving unit in response to the sum output enable signal.

6. The data output circuit according to claim 5, wherein the driving unit includes a PMOS transistor and a NMOS transistor which have a common gate to form an input terminal and a common drain to form an output terminal.

7. The data output circuit according to claim 5, wherein the control unit includes a switch means for applying a power voltage to the driving unit in response to the sum output enable signal.

8. The data output circuit according to claim 5, wherein the falling clock driving unit further comprises a latch means for maintaining a potential of an output terminal.

* * * * *